United States Patent [19]

Johansson

[11] Patent Number: 5,587,685
[45] Date of Patent: Dec. 24, 1996

[54] SYSTEM FOR SUPPRESSING POWER TRANSIENTS WHEN CONNECTING A DISK DRIVE IN AN OPERATING RAID SYSTEM

[75] Inventor: Christopher W. Johansson, Horseshoe Bend, Id.

[73] Assignee: Hewlett-Packard Company, Palo Alto, Calif.

[21] Appl. No.: 562,263

[22] Filed: Nov. 22, 1995

Related U.S. Application Data

[63] Continuation of Ser. No. 331,468, Oct. 31, 1994, abandoned.

[51] Int. Cl.$^6$ .................................................... G05F 3/02
[52] U.S. Cl. .................. 327/546; 361/58; 361/110; 361/111; 361/118; 323/908; 307/43; 327/384
[58] Field of Search ........................ 327/545, 546, 327/551, 552, 379, 380, 384, 385; 361/58, 18, 90, 91, 101, 110, 111, 43; 323/901, 908

[56] References Cited

U.S. PATENT DOCUMENTS

| | | | |
|---|---|---|---|
| 4,233,566 | 11/1980 | Nestorovic | 330/59 |
| 4,245,270 | 1/1981 | Busby | 361/58 |
| 4,329,705 | 5/1982 | Baker | 357/43 |
| 4,620,272 | 10/1986 | Fulton et al. | 363/53 |
| 5,268,592 | 12/1993 | Bellamy et al. | 361/58 |
| 5,283,707 | 2/1994 | Conners et al. | 361/58 |
| 5,313,358 | 5/1994 | Severinsky | 361/118 |
| 5,383,081 | 1/1995 | Nishikawa | 361/58 |

OTHER PUBLICATIONS

"Limiting Voltage & Current Transients On PCB Power Inputs" by Matthew Knight, pp. 002–005, Sep. 1994.
Technical Information "Increasing Reliability Of SMD Tantalum Capacitors In Low Impedance Applications" by David Mattingly, pp. 005–015, Sep. 1994.

*Primary Examiner*—Timothy P. Callahan
*Assistant Examiner*—Kenneth B. Wells

[57] ABSTRACT

Individual devices of a redundant array of independent devices (RAID) are coupled to an electrical power supply. For devices having widely varying load impedances, such as disks, incident with the coupling of electrical power thereto, the replacement or addition of a device in the system, while the system is in operation, causes unacceptable power transients in the power supply. To minimize such power transients, a transient suppression circuit is employed to isolate the load impedance of the device from the power supply. Isolation is achieved in the transient suppression circuit by employing an active circuit element, such as a MOSFET power transistor, as the power coupler. A capacitor controlled voltage divider circuit, incident with the coupling of electrical power thereto, couples a time varying gate voltage, which changes as a function of the rate of charge of the capacitor, to the MOSFET power transistor. This slowly increases MOSFET conduction, thereby providing controlled conductive coupling of the electrical load of the device to the power supply.

8 Claims, 2 Drawing Sheets

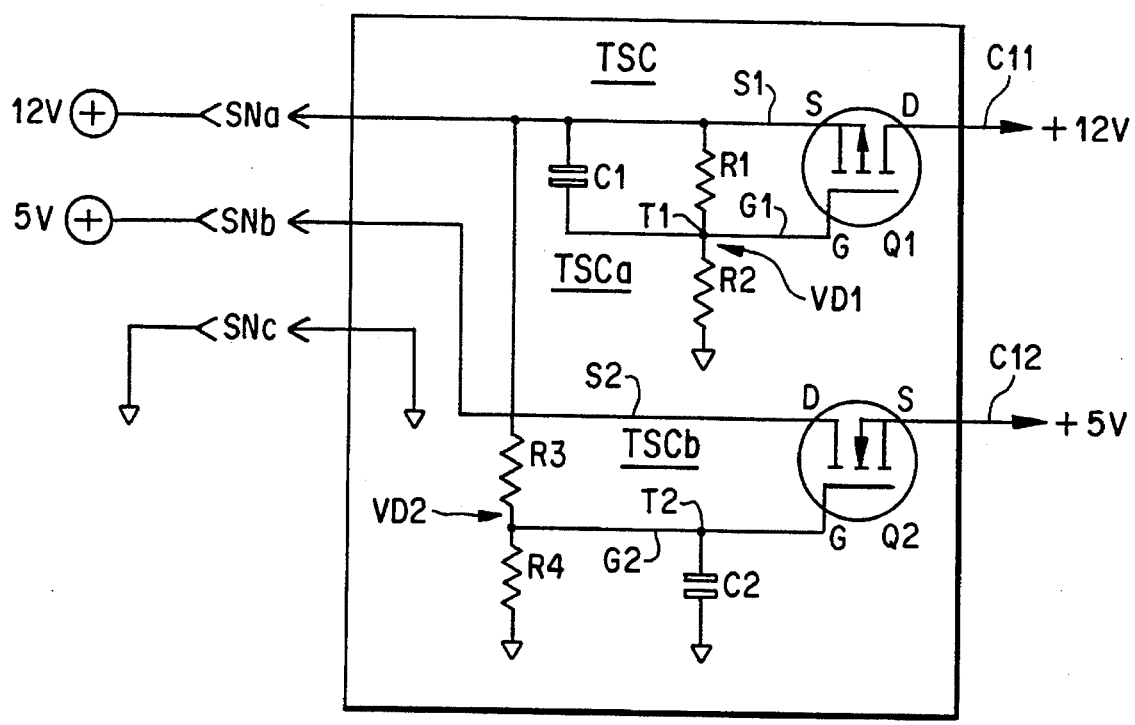
F I G. 2

SYSTEM FOR SUPPRESSING POWER TRANSIENTS WHEN CONNECTING A DISK DRIVE IN AN OPERATING RAID SYSTEM

This is a continuation of copending application Ser. No. 08/331,468 filed on Oct. 31,1994, now abandoned.

TECHNICAL FIELD

This invention relates generally to systems comprising pluralities of devices which are connected to an electrical power supply, in which provision is made for reducing power transients which occur at the time of the connection of a device to the electrical power supply when the system is in operation. In particular, this invention relates to systems embodying redundant arrays of independent devices (RAID), in which, to maintain data and/or reliability, a device, such as a disk drive, is required to be connected to the electrical power supply and integrated into the system while the system is in operation.

BACKGROUND OF THE INVENTION

The need for cost effective improvement of mass storage capacity in disk drives has led to the development of redundant arrays of independent devices, such as disk drives, herein referred to as "disks". While disks are usually referred to in describing this invention, it is to be understood that such reference is only for convenience of disclosure and is intended to characterize other devices. The disks are electrically coupled in various arrays and are powered by a common electrical power supply. In these arrays, a typical disk subsystem comprises one or more disk controllers for accessing and controlling the function of individual disks, the functional relationships among the disks and the combinations of disk outputs, to present an appearance, in one RAID mode of operation, of an output from a single disk. Requests to read data from the disks or to write data to the disks are made by a host computer via the disk controllers which establish and maintain the communication link for each request. In this regard, array management software may execute in the disk subsystem (e.g., the disk controllers), or in the host computer, in orchestrating the RAID function.

The disks are electrically powered by an electrical power supply. When a disk is in operation in the system, the power demand for the disk spindle motor, the rotary actuator motor, magnetic head amplifiers, filter capacitors and other miscellaneous disk circuits is substantially constant and there are no significant power transients. The primary causes of power transients, however, at the time of connection of the disk to the power supply are the filter capacitors of the disk: drive. At the time of connection the capacitors are not charged. Since the capacitors are not charged they present a short circuit to the power supply at the time of connection. This is the primary cause of a significant power transient in the electrical power supply. Other types of devices may present similar power transient problems.

The disks are connected in parallel to the electrical power supply which also supplies power to all electrical components and circuits in the network, including those involved in critical management and logic functions. Power transients in the system, such as momentary power drops, may also disturb the disk speed or disrupt logic circuits sufficiently to disrupt critical RAID system functions, which is unacceptable. Maintenance of, or enlargement of, RAID system data capacity and reliability requires the connection of disks to the system from time-to-time while the system is in operation. Such a connection of a disk, or other device, to the RAID system, whether accomplished manually or automatically, is known as a "hot swap" or "hot plugging".

The suppression of power transients incident with the connection of a disk to the power supply in a RAID system has received continuing attention. One approach, involving the manual connection of a disk to the power supply of a RAID system, employs an electrical plug connector. The connector has extended length precharge pins. These "precharge" pins have a small resistor connected thereto. When connection is made, this resistor is coupled in series with the power supply. The function of the resistor is to limit current and to precharge capacitors on the device so that when the connection is made to the power bus with the shorter pins there is a smaller difference in voltage and, hence, a smaller transient.

There are a number of problems with this approach. First, the resistor often has only an intermittent use power rating, e.g., does not have a power rating sufficient to handle the full device current for a long period of time. Therefore, if the connector plug is not fully inserted into the connector receptacle, so that the short pins are quickly engaged, there is a risk of destroying the resistor. The use of a resistor rated for continuous duty to handle the current load, would mean very large and costly parts. The second problem is mostly a cost issue as connectors with multiple pin lengths are more expensive than connectors with only pins of one length. The third problem is that this method of transient suppression is very dependent upon device characteristics as well as timing involved with the insertion of the device, such as a disk.

There exists a need for a transient suppression system and method which are independent of device characteristics and in which timing is automatic.

SUMMARY OF THE INVENTION

A RAID system of independent devices, such as disks, is functionally arranged and controlled, according to one mode of operation, to present an image to an operating environment, such as a host computer, as though the array were a single disk. In another mode of operation, the array may appear as multiple disks of a predetermined arrangement. The individual disks are powered by an electrical power supply to which the disks are connected. Switches and/or plug connectors are employed to connect the disks to the electrical power supply. The switches may be mechanical, electromechanical or solid state electrical types of switches.

When the system is in operation, there is need, from time-to-time, to replace or to add a disk to the RAID system. To minimize power transients in the power supply, incident with such connections, a transient suppression circuit is provided, either at the location in the RAID assembly where the connection is to be made, or, as part of the power input circuit to the disk where it is a part of the disk electrical system. At the time, or shortly after the time, that the disk is connected to the power supply, this transient suppression circuit begins to conduct, and, after a short interval of time, controlled by the transient suppression circuit, is fully conducting. This interval of increasing conduction isolates the impedance characteristic of the load from the power supply and thereby controls the power transient.

The transient suppression circuit comprises an active circuit element. The output circuit of this active circuit element is coupled as input to the disk. The disk is not operating at the time that it is connected to the power supply. The active circuit element is the variable conductor which isolates the load and prevents a power transient at the instant of connection. The active circuit element is preferably a MOSFET power transistor controlled by a capacitor controlled voltage divider circuit which, upon connection to the power supply voltage, initiates and provides the timing function of the transient suppression circuit.

BRIEF DESCRIPTION OF THE DRAWINGS

This invention will be better understood by reference to the following specification when considered in conjunction with the accompanying drawings, in which:

FIG. 2 illustrates transient suppression circuit implementations embodied in the presently known best mode for practicing this invention.

DESCRIPTION OF THE PREFERRED EMBODIMENT

Figure 1:
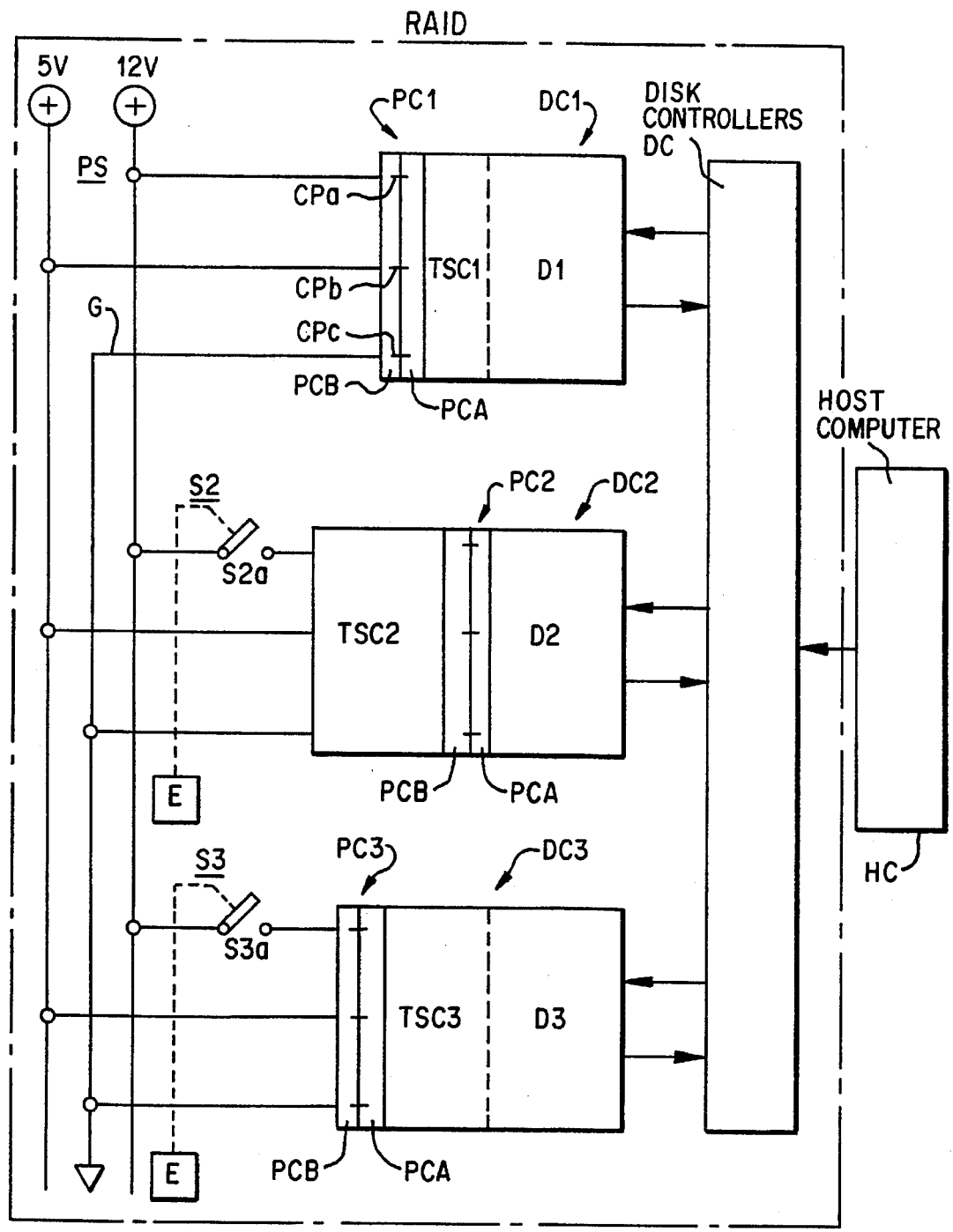
FIG. 1 is a block diagram of a RAID system embodying a transient suppression circuit.

FIG. 1 illustrates one type of several types of RAID systems and serves to illustrate the principles of this invention. One type of RAID system comprises a plurality of devices, D1, D2, D3, such as disks, which are interconnected and controlled in communication with a host computer, HC, via one or more disk controllers, DC, which manage the disk array. A RAID system, such as this, may function in one mode to present the appearance of a single disk to the host computer. Requests by the host computer HC to read or to write data are translated by the disk controller(s) to head(s), track(s) and track sector(s) (not shown) at the disks where data may be read or written. Reading or writing at the disks may take place on one or more disks in the array, depending upon array management. Raid systems being well known and their array management function not being essential to an understanding of this invention, further description of the Raid function is believed to be unnecessary.

FIG. 1 illustrates three different ways in which the transient suppression circuit may be functionally integrated with a device. Each disk, D1, D2, D3, is in a device circuit, DC1, DC2, DC3, connected to an electrical power supply, PS. Each device circuit includes a transient suppression circuit, TSC1, TSC2, TSC3, respectively. The power supply, PS, comprises two power circuits of different voltages, 12 v and 5 v, respectively, and a common circuit, G, usually at ground potential. Electrical connections in the form of connectors, PC1, PC2, PC3, and switches, S2, S3, are provided in the device circuits. The connectors may be of the plug connector type.

There being three circuits in the power supply, each connector, PC1, PC2, PC3, has three poles, in the form of connector pins CPa, CPb, CPc. As will be seen from FIG. 2, only one switch power pole S2a, S3a, is needed to connect the 12 v power supply circuit to the respective transient suppression circuits TSC2, TSC3. Electromagnetically operated switches are shown to simplify conception. Solid state switching is preferably employed in the array environment.

The first device circuit, DC1, in the RAID system integrates the transient suppression circuit TSC1 electrically and physically with the device, D1. With this arrangement, the connector is employed to manually connect the device, D1, to the power supply, PS. Thus, the transient suppression circuit function is initiatsd immediately when the connector parts, PCA, PCB, are joined.

When the device is to be installed as a spare, for anticipated future use, for example, circuits such as device circuits, DC2, DC3, are useful in making a device installation in preparation for future use.

In device circuit DC2, the switch, S2, connects the transient suppression circuit, TSC2, to the 12 v power supply. This switch is normally open, as shown, and there is no 12 v power connection to the transient suppression circuit, TSC2. The device, D2, is connected to the transient suppression circuit by the plug connector, PC2. This circuit provides a basis for the automatic connection of the device, D2, into the RAID system by energizing the electromagnetic actuator, E, closing the switch, S2, and coupling the 12 v power supply to the transient suppression circuit, TSC2, initiating the transient suppression function in preparation for connection of the device, D2, to the power supply, PS.

The device circuit, DC3, is functionally similar to the device circuit, DC2. It differs in the location of the plug connector, PC3. As in the device circuit, DC1, the device, D3, the transient suppression circuit, TSC3, and the plug connector part, PCA, of the plug connector, PC3, are electrically and mechanically integrated.

Other arrangements of the device circuits will be apparent to those skilled in the art.

In the event that a RAID system requires only a single voltage, such as the voltage 12 v, the connectors and the switches, each require only one power pole.

Upon the application of power, the transient suppression circuits, TSC, function as time varying conductors in which conduction builds up slowly. This function effectively isolates the load impedance of the device from the power supply. Thus, assuming the devices, D1, D2, D3 are disks, when the RAID system is in operation with disks, D1 and D2, operating, if there is a need to connect the disk, D3, to the RAID system, the switch, S3, is closed. The full power of the power supply circuit is coupled to the input of the transient suppression circuit but the rate of change of power across the circuit is slow enough to avoid an unacceptable power transient in the system. The rate at which power increases in the load circuit of the device, D3, is controlled entirely by the transient suppression circuit, not by the load connected to it.

As detailed in FIG. 2, a transient suppression circuit according to the best known mode for practicing this invention, comprises an active circuit which is controlled by a capacitor controlled voltage divider circuit responsive to the voltage of the power supply, whether the power supply has one or two different voltages.

In the best known mode for practicing this invention, the active circuit of the transient suppression circuit, for either the 12 v or the 12 v, 5 v power supply, comprises a MOSFET power transistor, Q1, or Q2, respectively as the time varying conductor. This is seen in FIG. 2. When the transient suppression circuit, TSCa or TSCb, is first connected to the power supply, PS, the power transistor, Q1 or Q2, is off. After the power connection, the conduction of the power transistor, Q1 or Q2, increases as a function of time, time varying conduction, controlled by the capacitor, C1 or C2, slowly increasing the voltage coupled to the disk. When the power transistor is fully conducting, the power supply "sees" the load impedance of the disk which is now powered directly from the power supply. Full conduction timing of the power transistor is timed to permit the load impedance to have stabilized.

There are two forms of transient suppression circuits, TSC, illustrated in FIG. 2, TSCa, TSCb. The first, TSCa, is used when there is no voltage supply available which is greater than the voltage being turned on (e.g., a single supply or the highest voltage supply, here, 12 v). The second, TSCb, is used when there is a higher voltage available in the power supply than the voltage being turned on (e.g., turning on 5 v when 12 v is available).

The first form of transient suppression circuit, TSCa, uses a P channel MOSFET power transistor, Q1 such as seen in FIG. 8 of "Technical Information, Increasing Reliability of SMD Tantalum Capacitors In Low Impedance Applications", pgs. 005 to 015, by David Mattingly, and as seen in "Limiting Voltage And Current Transients On PCB Power Inputs, pgs. 002 to 005, by Matthew Knight. This power transistor comprises a source electrode, S, a drain electrode, D, and a gate electrode, G. The output circuit of the transient suppression circuit is C11. The source electrode circuit, S1, comprises the input circuit. The gate electrode circuit, G1, is coupled to and controlled by an intermediate tap, T1, on a resistor type of voltage divider circuit, VD1, the tap voltage of which, in turn, is controlled by a capacitor, C1. The voltage divider circuit comprises the resistors, R1 and R2, which are connected in series between the source electrode circuit, S1, and ground. The capacitor, C1, is connected between the source electrode circuit, S1, and the intermediate tap, T1, on the voltage divider circuit, VD1.

At the time when the power supply circuit, 12 v, is connected to the transient suppression circuit, TSCa, the tap, T1, is at 12 v. This tap voltage which is coupled directly to the gate, G, gates the power transistor, Q1, off. The tap voltage at the tap, T1, as controlled by the capacitor, decreases and the power transistor, Q1, begins to conduct, being turned on fully when the current flow at the capacitor, C1, ceases. The voltage at the tap, T1, is now a function of the ratio of the ohmic values of the resistors, R1 and R2, which gates the power transistor Q1 for full conduction.

The second form of transient suppression circuit, TSCb, employs the voltages of both power circuits, 12 v and 5 v, to couple power into the 5 v output circuit, C12. This transient suppression circuit, TSCb, comprises an N channel MOSFET power transistor, Q2, a voltage divider circuit, VD2, and a capacitor, C2. The source electrode, S, is connected in the electrode output circuit, C12. The drain electrode, D, is connected in the input circuit, S2, which is coupled by the connector, SNb, to the 5 v power circuit, and the gate electrode, G, is connected to the tap, T2, of the voltage divider, VD2, by the gate circuit, G2. The voltage divider circuit, VD2, comprises resistors, R3 and R4, connected in series between 12 v and ground. The capacitor, C2, is connected between the tap, T2, (the gate circuit, G2,) and ground.

At the instant that the connectors SNa, SNb and SNc are coupled, the capacitor, C2, holds the gate circuit, G2 at ground potential. This prevents the power transistor, Q2, from conducting. The current flow at the capacitor, C2, is controlled by the resistor, R3. The rising voltage at the tap, T2, of the voltage divider circuit, VD2, raises the gate voltage of the power transistor, Q2, and conduction increases correspondingly. When current flow at the capacitor C2 ceases, the voltage at the tap, T2, reaches its highest value, set by the resistors, R3 and R4, and the power transistor, Q2, is fully conducting.

The advantages of these transient suppression circuits are that the turn on time is automatically controlled by the values of the resistors and the capacitors in the control circuits; there is no passive current limiting element in the power circuits, so the problem of power dissipation in such an element is eliminated; the load being coupled to the power supply is isolated from the power supply, and, since the timing function is automatic, there is no need for connectors with pins of different lengths.

While the transient suppression system has been described herein making reference to disks as an example of devices being connected to the power supply, other devices may be similarly connected as required. Further, differently configured RAID systems may also be equipped with transient suppression circuits embodying the principles of the types disclosed herein.

What is claimed is:

1. A system of control for electrically interconnected discrete devices, comprising:

a. an electrical power supply having at least a first and a second voltage terminal;

b. a plurality of discrete devices connected to said electrical power supply;

c. a device controller for electrically controlling said discrete devices in a predetermined functional relationship;

d. at least a first and second transient suppression circuit (TSC) coupled to at least one of said plurality of discrete devices, for suppressing transient currents, said first TSC comprising a first active circuit element, and said second TSC comprising a second active circuit element, and each said active circuit element having an output terminal connected to said at least one discrete device and having an active circuit element input;

e. said first transient suppression circuit further comprising a first capacitor and voltage divider circuit for generating a time varying voltage signal input to said first active circuit element to control conduction of said first active circuit element;

f. said second transient suppression circuit further comprising a second capacitor and voltage divider circuit for generating a time varying voltage signal input to said second active circuit element to control conduction of said second active circuit element; and, g. connector means for coupling one of said power supply voltage terminals to said first active circuit element input and to said first and second capacitor and voltage divider circuits, and the other of said power supply voltage terminals to said second active circuit element input, and wherein said connector means include, a plurality of pin connectors each having a substantially similar length.

2. The system according to claim 1, in which:
   said active circuit elements are power transistors.

3. The system according to claim 2, in which:
   a. said power transistors are a first P-Channel MOSFET power transistor and a second N-channel MOSFET power transistor.

4. The system according to claim 1, in which:
   a. said first active circuit element is a power transistor having a source, a drain and a gate, said drain being connected to said first active circuit element output terminal, said source being connected to said power supply first voltage terminal by said connector means;

b. said first voltage divider circuit comprises at least two series connected resistors having an intermediate tap connected to said first power transistor gate, said connector means connecting said first voltage divider circuit to said power supply first voltage terminal; and c. at least a first capacitor of said first capacitor and voltage divider circuit being connected to said intermediate tap of said first voltage divider circuit and having a charging rate controlled by one of said resistors of said first voltage divider circuit.

5. The system according to claim 1, in which:
   a. said second active circuit element is a power transistor having a source, a drain and a gate, said drain being connected to said power supply second voltage terminal by said connector means, said source being connected to said second active circuit output terminal;
   b. said second voltage divider circuit comprises at least two series connected resistors having an intermediate tap connected to said second power transistor gate;
   c. at least a second capacitor of said second capacitor and voltage divider circuit connected to said, intermediate tap of said second voltage divider circuit and having a charging rate controlled by one of said resisters of said second voltage divider circuit; and
   d. said second voltage divider circuit is connected to said power supply first voltage terminal by said connector means.

6. A system of electrically interconnected discrete devises having means for connecting or disconnecting one of said discrete device to the system while the system is in operation, comprising:
   a. an electrical power supply having a first and second voltage terminal;
   b. a plurality of discrete devises connected to said electrical power supply;
   c. a devise controller for electrially controlling said discrete devises in a predetermined functional relationship;
   d. a first voltage P-channel MOSFET active circuit element for coupling electrical power from said power supply first voltage terminal to said one of said discrete devises and a second lower voltage N-channel MOSFET active circuit element for coupling electrical power from said supply second voltage terminal to said one of said discrete devices.
   e. a first voltage divider and capacitor circuit for producing a first control signal whose amplitude changes with time, initiated when electrical power is coupled to said first voltage divider and capacitor circuit, said first control signal for initiating time varying conduction of said first voltage P-channel MOSFET for a predetermined interval of time;
   f. a second voltage divider and capacitor circuit for producing a second control signal whose amplitude changes with time, initiated when electrical power is coupled to said first voltage divider and capacitor circuit, for initiating time varying conduction of said second lower voltage N-channel MOSFET for a predetermined interval of time; and,
   g. an electrical connector for coupling said first voltage P-channel MOSFET, and said first and second voltage divider and compacitor circuits to said electrical power supply first voltage terminal, and said second voltage N-channel MOSFET to said electrical power supply second terminal, said electrical connector having pin connectors of substantially similar length.

7. A system for suppressing power transients when electrically connecting a discrete device to a power supply, comprising:
   a. an electrical power supply having a plurality of voltage terminals with at least two of the voltage terminals having a different voltage;
   b. a plurality of transient suppression circuits (TSCs) coupled to the discrete device for suppressing transient currents, each TSC comprising, respectively:
      i. an active circuit element having an input and output terminal, the output terminal being connected to the discrete device; and,
      ii. a capacitor and voltage divider circuit for generating a time varying voltage signal to control conduction of the active circuit element; and,
   c. connector means having a plurality of similar length pin connectors for coupling the power supply to the TSCs, and wherein:
      i. a first one of the voltage terminals is coupled to: the active circuit element input terminal and the capacitor and voltage divider circuit of a first one of the TSCs, and the capacitor and voltage divider circuit of a second one of the TSCs; and,
      ii. a second one of the voltage terminals is coupled to the active circuit element input terminal of the second one of the TSCs.

8. A system for suppressing power transients when electrically connecting a first discrete device to a power supply that is electrically interconnected with at least a second discrete device, comprising:
   a. an electrical power supply having a plurality of voltage terminals for providing at least two different voltages;
   b. a plurality of transient suppression circuits (TSCs), each TSC including a capacitor and voltage divider circuit coupled to an active circuit element to control conduction of the active circuit element, and each active circuit element having an input and output terminal, the output terminal being connectable to the first discrete device; and,
   c. connector means having similar length connector pins, for connecting the power supply to the TSCs, and wherein the capacitor and voltage divider circuits of a first and second TSC of the plurality of TSCs, and the active circuit element input terminal of the first TSC, are further coupled to a first one of the voltage terminals via the connector means, and the active circuit element input terminal of the second TSC is coupled to a second one of the voltage terminals via the connector means.

* * * * *